(12) United States Patent
Cheong

(10) Patent No.: US 6,605,520 B2
(45) Date of Patent: Aug. 12, 2003

(54) METHOD OF FORMING SILICON-GERMANIUM FILM

(75) Inventor: Woo Seock Cheong, Kyungki-Do (KR)

(73) Assignee: Hynix Semiconductor Inc, Kyungki-do (KR)

( * ) Notice: Subject to any disclaimer, the term of this patent is extended or adjusted under 35 U.S.C. 154(b) by 40 days.

(21) Appl. No.: 10/033,321

(22) Filed: Dec. 27, 2001

(65) Prior Publication Data

US 2002/0098671 A1 Jul. 25, 2002

(30) Foreign Application Priority Data

Dec. 29, 2000 (KR) .................................. 2000-0085176

(51) Int. Cl.[7] ...................... H01L 21/00; H01L 21/8247
(52) U.S. Cl. ...................... 438/592; 438/592; 438/964; 438/260
(58) Field of Search .................. 438/257–267, 438/585, 592, 933, 964

(56) References Cited

U.S. PATENT DOCUMENTS

| | | | | |
|---|---|---|---|---|
| 5,943,571 A | * | 8/1999 | Schaefer et al. | 438/257 |
| 5,998,289 A | | 12/1999 | Sagnes | |
| 6,060,743 A | * | 5/2000 | Sugiyama et al. | 257/321 |
| 6,090,666 A | * | 7/2000 | Ueda et al. | 438/257 |
| 6,297,095 B1 | * | 10/2001 | Muralidhar et al. | 438/257 |
| 6,410,412 B1 | * | 6/2002 | Taira et al. | 438/594 |
| 6,413,819 B1 | * | 7/2002 | Zafar et al. | 438/257 |

* cited by examiner

*Primary Examiner*—Richard Booth
(74) *Attorney, Agent, or Firm*—Marshall, Gerstein & Borun

(57) ABSTRACT

A method of forming a silicon-germanium (SiGe) film for a gate electrode. In a metal gate manufacture process, as the content of germanium (Ge) is increased, the surface roughness of the silicon-germanium (SiGe) film is increased, which makes difficult to secure an acceptable electrical characteristic as well as a set-up. In order to solve these problems, a method includes the spraying with a high density silicon micro-crystallite capable of increasing the nucleus creation efficiency on a gate oxide using a plasma or a tungsten (W) filament before depositing a silicon-germanium (SiGe) film. Thus, as micro-crystalline grains are formed during a preliminary stage of the silicon-germanium (SiGe) film deposition, a silicon-germanium (SiGe) film can be deposited with a reduced surface roughness.

34 Claims, 2 Drawing Sheets

$SiH_4 + H_2$, Filament $SiH_4 + GeH_4 + H_2$

METHOD OF FORMING SILICON-GERMANIUM FILM

TECHNICAL FIELD

A method of forming a silicon-germanium (SiGe) film, and more particularly to, a method of forming a silicon-germanium (SiGe) film capable of improving the set-up and electrical characteristics of a gate structure by reducing the surface roughness of the silicon-germanium (SiGe) film is disclosed.

BACKGROUND

The silicon-germanium (SiGe) film is a polycrystal film in which silicon (Si) and germanium (Ge) are combined. In the silicon-germanium (SiGe) film, germanium (Ge) has a larger size than silicon (Si) and has a melting temperature of about 936° C. which is lower than that of silicon (Si). Therefore, the silicon-germanium (SiGe) film could be easily grown with polycrystalline even at a relatively low temperature ranging from about 450 to about 550° C. This silicon-germanium (SiGe) film has advantages that it can prevent a penetration phenomenon of boron (B) in $P^+$-type polysilicon, reduce the resistance value of a polysilicon layer due to activated boron dopant and reduce a depletion phenomenon of polysilicon, and can be manufactured in a current process of manufacturing silicon. Thus, it is expected that the silicon-germanium (SiGe) film may be used as a gate electrode material of next-generation semiconductor devices.

However, there is a problem incorporating SiGe films into current processes. In silicon-germanium (SiGe) films, as germanium (Ge) has a larger grain size than silicon (Si), the surface of the silicon-germanium (SiGe) film is rougher than a silicon (Si) film in which germanium (Ge) is not present. Therefore, as the content of germanium (Ge) increases, the surface roughness of the silicon-germanium (SiGe) film increases. Thus, if the silicon-germanium (SiGe) film with a rough surface is used as a gate electrode, it adversely affects an electrical characteristics of a gate structure as well as the gate structure.

The degree of the surface roughness can be described by means of a micro-structure evolution rule. According to the micro-structure evolution rule, a film is grown by an island growth mechanism if the material characteristic is completely different in a crystal growth of the film. At this time, the nucleus creation density affects the size limit of growing grains. Thus, as the size of grain is larger, the roughness of the film is increased.

In order to obtain a flat surface in a polysilicon film containing a large quantity of germanium (Ge), it is important that the density of the nucleus density is initially increased to form a thin film with micro-crystallite. For this, a method of first forming a silicon seed layer on a gate oxide or for polishing a silicon source gas has been employed.

The method of forming the silicon seed layer includes forming amorphous silicon with a thickness ranging from about 10 to about 100 Å on the gate oxide. This allows the silicon-germanium (SiGe) film to be easily grown into crystalline without being island-grown on the same silicon surface. Thus, there is a disadvantage that the nucleus creating density of the seed layer could not be increased by the surface reaction of a low temperature though the seed layer can be simply formed by continuous process but the film itself is amorphous.

The method of polishing the silicon source gas includes forming silicon monomer to the degree that it is not deposited on the gate oxide by including a large quantity of carrier gas such as hydrogen ($H_2$) and the like into silane ($SiH_4$) before the silicon-germanium (SiGe) film is deposited. In case of forming the silicon-germanium (SiGe) film using this method, there is a disadvantage that stability with respect to uniformity control is lowered.

As such, a common problem in the above two methods is that the nucleus creating potential of the silicon-germanium (SiGe) film is low. The reason is that the silicon-germanium (SiGe) film is not micro-crystalline. In other words, the seeding efficiency of these methods can be lowered since it is not micro-crystalline. More particularly, nucleus creation is advantageous in crystalline the interface energy of which is relatively low.

SUMMARY OF THE DISCLOSURE

A method of forming a silicon-germanium (SiGe) film capable of improving set-up and electrical characteristics of a gate structure by reducing the surface roughness of the silicon-germanium (SiGe) film is disclosed.

A method of forming a silicon-germanium (SiGe) film is disclosed which is characterized in that it comprises the steps of: fixing a semiconductor substrate in which a gate oxide is formed, within a deposition chamber; flowing $SiH_4$ and $H_2$ into said deposition chamber and forming silicon micro-crystallite on the surface of said gate oxide using a plasma system; and flowing $SiH_4$, $GeH_4$ and $H_2$ into said deposition chamber to deposit silicon-germanium around a plurality of the silicon micro-crystallite.

Also, a method of forming a silicon-germanium (SiGe) film is disclosed which is characterized in that it comprises the steps of: fixing a semiconductor substrate in which a gate oxide is formed, within a deposition chamber; flowing $SiH_4$ and $H_2$ into said deposition chamber and forming silicon micro-crystallite on the surface of said gate oxide using a lot of thermal electrons emitted from a filament; and flowing $SiH_4$, $GeH_4$ and $H_2$ into said deposition chamber to deposit silicon-germanium around a plurality of the silicon micro-crystallite.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

Figure 1A:
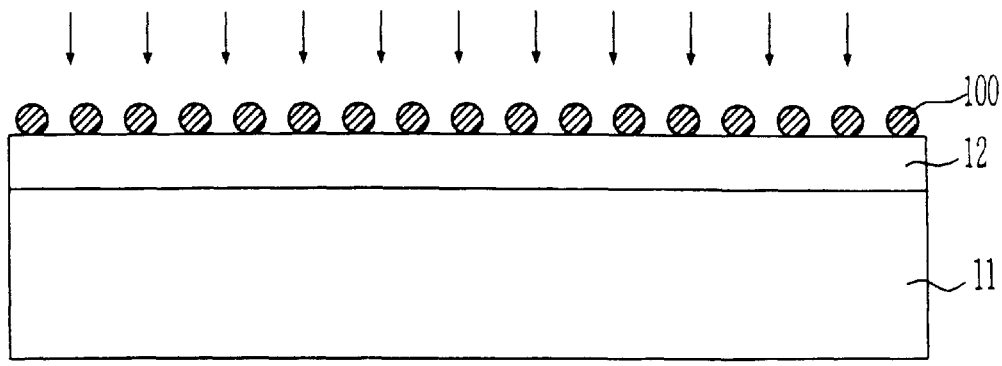
FIGS. 1A to 1C are cross-sectional views for describing a method of forming a silicon-germanium (SiGe) film according to a first disclosed method.
Figure 1B:
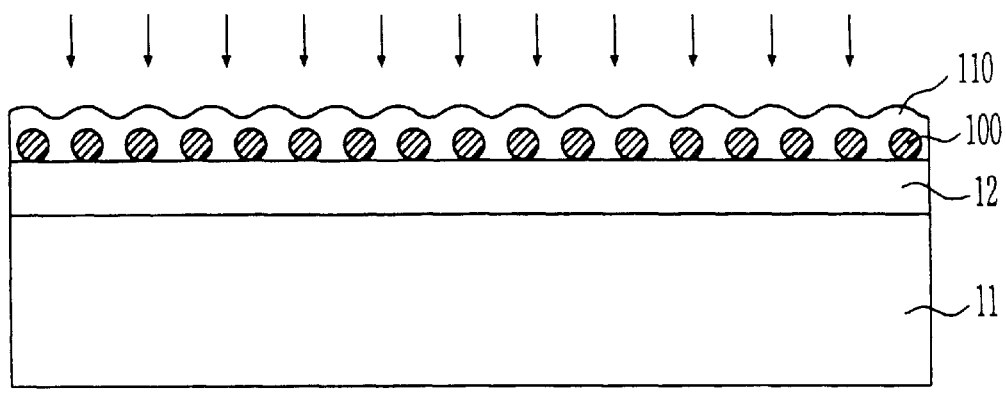
Figure 1C:
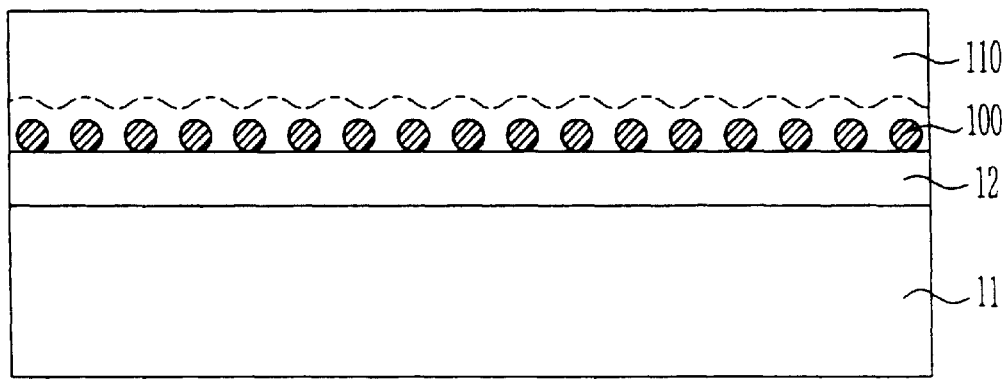

The disclosed methods will be described in detail by way of preferred embodiments with reference to accompanying drawings. FIGS. 1A to 1C are cross-sectional views for describing a method of forming a silicon-germanium (SiGe) film according to a first disclosed method.

Referring now to FIG. 1A, a device isolation region is formed in a semiconductor substrate 11 to define an active region and a field region. A gate oxide 12 is formed on the semiconductor substrate 11 in the active region. The semiconductor substrate 11 in which the gate oxide 12 is formed is fixed within a deposition chamber. Thereafter, $SiH_4$ and H₂ are flowed into the deposition chamber and silicon micro-crystallite 100 is then formed on the gate oxide 12 using a plasma system.

In the above, a process condition for forming the silicon micro-crystallite 100 is as follows.

The flow rate of SiH₄ being a silicon source gas ranges from about 5 to about 100 sccm and the flow rate of H₂ being a carrier gas ranges from about 50 to about 1000 sccm. During the time when the silicon micro-crystallite 100 is formed, the pressure within the deposition chamber is maintained at several to several hundred mTorr. In order to form the silicon micro-crystallite 100 having polycrystalline, the temperature of the semiconductor substrate 11 ranges from about 450 to about 600° C. The plasma system may include a common plasma generator installed within the deposition chamber or a remote plasma generator installed outside the deposition chamber. The pressure of the plasma power at a range from about 10 to about 500 W. The size of each of the silicon micro-crystallite 100 formed under these conditions ranging from about 1 to about 7 nm and the distance between the respective crystalline is very narrow. Each of the silicon micro-crystallite 100 is grown independently from the surface state of the gate oxide 12 and has a polycrystalline state. Meanwhile, the size of the silicon micro-crystallite 100 can be controlled by the plasma power and gas flow rate.

Referring now to FIGS. 1B and 1C, SiH₄, GeH₄ and H₂ are flowed into the deposition chamber to deposit silicon-germanium (SiGe) around a plurality of silicon micro-crystallite 100, thus forming a silicon-germanium film 110.

In the above, the silicon micro-crystallite 100 is used as a nuclear creation site of the silicon-germanium film 110. As shown in FIG. 1B, at an initial deposition stage, silicon-germanium (SiGe) film is deposited around the silicon micro-crystallite 100, thus forming unit grains. The size of these unit grains is determined depending on a micro-structure evolution rule. As the silicon micro-crystallite 100 is formed with a high density, the size of the unit grains becomes necessarily small. If silicon-germanium (SiGe) is continuously deposited with the size of the unit grains small, the silicon-germanium film 110 the surface roughness of which is reduced can be obtained, as shown in FIG. 1C.

A process of forming the silicon-germanium film 110 is as follows. The flow rate of SiH₄ being the silicon source gas ranges from about 20 to about 500 sccm, the flow rate of GeH₄ being a germanium source gas ranging from about 5 to about 100 sccm and the flow rate of H₂ being a carrier gas ranging from about 100 to about 5000 sccm. The temperature of the semiconductor substrate 11 ranges from about 450 to about 600° C. During the time when silicon-germanium (SiGe) is deposited, the pressure within the deposition chamber ranges from about 1 to about 200 Torr. In the silicon-germanium film 110 formed by these conditions, the amount of germanium (Ge) contained within the film ranges from about 5 to about 50%. The amount of germanium (Ge) contained in the silicon-germanium film 110 can be controlled by the pressure, the temperature and the gas flow rate.

Figure 2A:
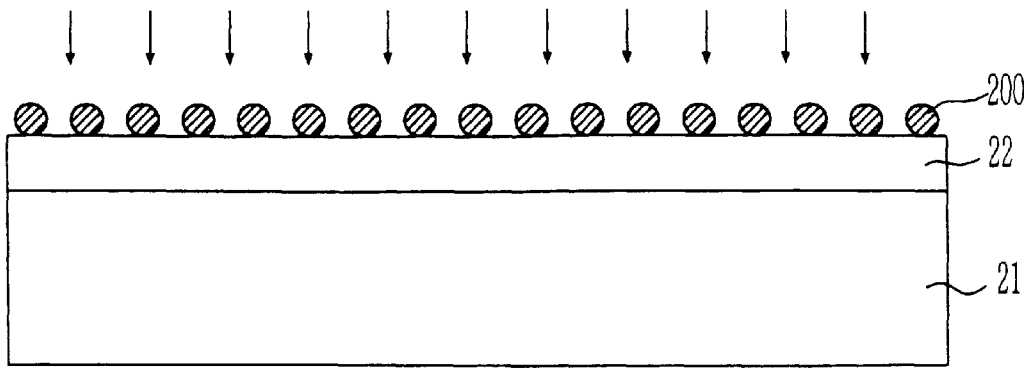
FIGS. 2A to 2C are cross-sectional views for describing a second disclosed method of forming a silicon-germanium (SiGe) film.
Figure 2B:
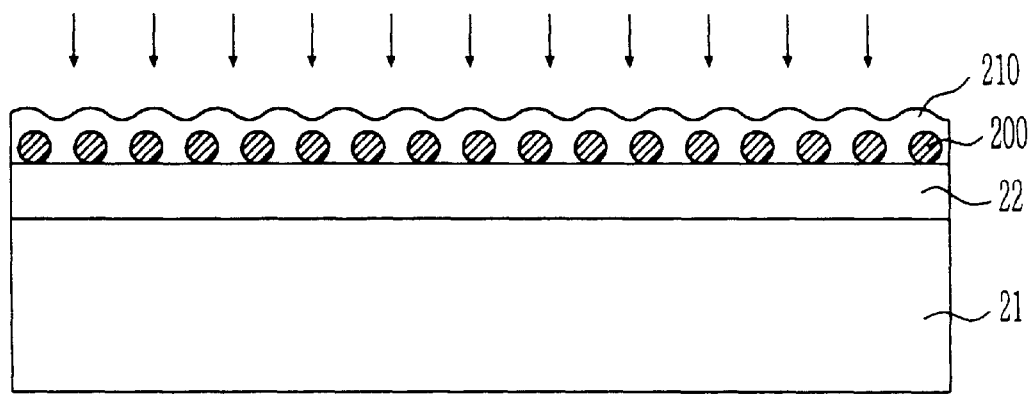
Figure 2C:
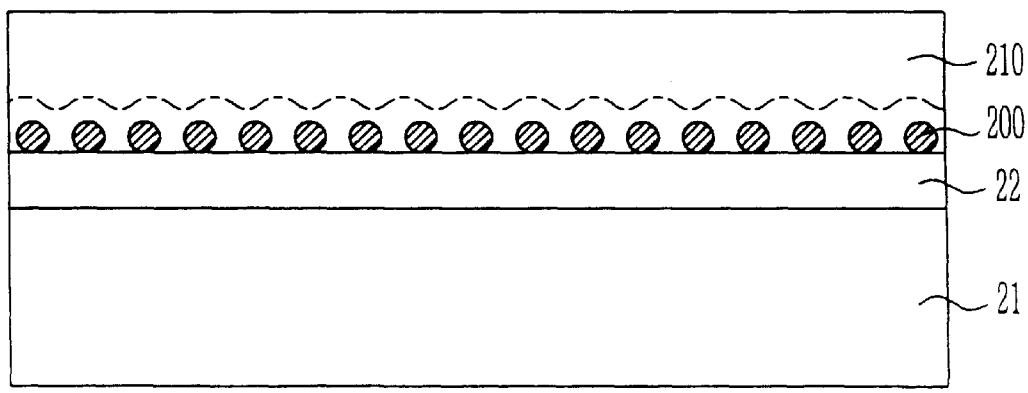

FIGS. 2A to 2C are cross-sectional views for describing a second method of forming a silicon-germanium (SiGe) film. Referring now to FIG. 2A, a device isolation film is formed in a semiconductor substrate 21 to define an active region and a field region. A gate oxide 22 is formed on the semiconductor substrate 21 in the active region. The semiconductor substrate 21 in which the gate oxide 22 formed is fixed within the deposition chamber. Thereafter, SiH₄ and H₂ are flowed into the deposition chamber and a filament is used to form silicon micro-crystallite 200 on the surface of the gate oxide 22.

In the above, a process of forming the silicon micro-crystallite 200 is as follows.

The flow rate of SiH₄ being a silicon source gas ranges from about 5 to about 100 sccm and the flow rate of H₂ being a carrier gas ranges from about 50 to about 1000 sccm. At this time, HCl in addition to SiH₄ and H₂ may optionally be flowed. If utilized, the flow rate of HCl should be below about 200 sccm. In order to form the silicon micro-crystallite 200 having polycrystalline, the temperature of the semiconductor substrate 21 ranges from about 450 to about 600° C. During the time when the silicon micro-crystallite 200 is formed, the pressure within the deposition chamber is kept between several and several dozen mTorr. A filament is installed inside a gas injection of the deposition chamber and the temperature ranges from about 1500 to about 2400° C. so that a large amount of thermal electrons can be emitted. The thermal electrons promote introduced SiH₄ from which a nucleus of micro silicon particles can be created in a gas phase. The filament is made of tungsten (Th(1–5%)-W), etc. in which about 1 to about 5% of tungsten (W) or thorium (Th) is contained. This tungsten-filament is connected by a molybdenum (Mo) rod. In order to prevent an increase in the temperature of the semiconductor substrate, the distance between the Mo rod and the substrate is kept between about 3 and about 5 cm and connection of the tungsten-filament to the Mo rod is made in parallel to the substrate in a radial shape. The size of each of the silicon micro-crystallite 200 formed under these conditions ranges from about 1 to about 7 nm and the distance between respective crystalline is very narrow. Each of the silicon micro-crystallite 100 is grown independently from the surface state of the gate oxide 22 and has a polycrystalline state. Meanwhile, the size of the silicon micro-crystallite 100 can be controlled by the temperature of the filament and the gas flow rate.

Referring now to FIGS. 2B and 2C, SiH₄, GeH₄ and H₂ are flowed into the deposition chamber to deposit silicon-germanium (SiGe) around a plurality of silicon micro-crystallite 200, thus forming a silicon-germanium film 210.

In the above, the silicon micro-crystallite 200 is used as a nuclear creation site of the silicon-germanium film 210. As shown in FIG. 2B, at an initial deposition stage, silicon-germanium (SiGe) is deposited around the silicon micro-crystallite 200, thus forming unit grains. The size of these unit grains is determined by a micro-structure evolution rule. As the silicon micro-crystallite 200 is formed with a high density, the size of the unit grains becomes necessarily small. If silicon-germanium (SiGe) is continuously deposited with the size of the unit grains small, the silicon-germanium film 210 the surface roughness of which is reduced can be obtained, as shown in FIG. 2C.

A process of forming the silicon-germanium (SiGe) film 210 is as follows. The flow rate of SiH₄ being a silicon source gas ranges from about 20 to about 500 sccm, the flow rate of GeH₄ being a germanium source gas ranges from about 5 to about 100 sccm and the flow rate of H₂ being a carrier gas ranges from about 100 to about 5000 sccm. The temperature of the semiconductor substrate 21 ranges from about 450 to about 600° C. During the time when silicon-germanium (SiGe) is deposited, the pressure within the deposition chamber ranges from about 1 to about 200 Torr. In the silicon-germanium film 210 formed by these conditions, the amount of germanium (Ge) contained within the film ranges from about 5 to about 50%. The amount of germanium (Ge) contained in the silicon-germanium film 210 can be controlled by the pressure, the temperature and the gas flow rate.

The above present invention can manufacture a silicon-germanium film which can be applied in a 0.13 □-below technology. In order to manufacture a smooth silicon-germanium film in the crystal property, there are method of initially forming silicon micro-crystallite of several nm and a method of applying the same. In order to manufacture a smooth polycrystal film, a lot of crystal particles must be initially sprayed. Micro-crystalline is used as a nucleus creation site when a silicon-germanium polycrystal film is formed. Clusters can be created in a gas phase, by means of charge-induced nucleation using plasma, electrons and ions, being gas phase activation. As the size of the silicon micro-crystallite is very small, in the range of about 1 to about 7 nm, the silicon micro-crystallite can promote particle nucleus creation since it has an outstanding characteristic in flexibility and rotation.

As can be understood from the above description, if the silicon micro-crystallite is used as a seed of a silicon-germanium film, the following effect can be obtained.

First, as the silicon micro-crystallite is micro-crystalline, it can increase the nucleus creation efficiency to thus provide a lot of nucleus creation site at an initial stage.

Second, the silicon micro-crystallite can be manufactured within a LPCVD SiGe manufacture apparatus having a plasma system without additional equipment.

Third, the silicon micro-crystallite is advantageous in controlling the growth rate since it does not form an existing seed layer.

Fourth, the silicon micro-crystallite is advantageous in the process stability since its formation process can proceed without regard to the surface state of a gate oxide.

Fifth, an increase in the applicability of the silicon-germanium film to a gate electrode in a next-generation high-integrated device achieved and, sixth, a maximization of the equipment efficiency is achieved since it can employ an existing production apparatus.

The present invention has been described with reference to particular embodiments in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed:

1. A method of forming a silicon-germanium film, comprising:
   fixing a semiconductor substrate on which a gate oxide is formed, within a deposition chamber;
   flowing $SiH_4$ and $H_2$ into said deposition chamber and forming a plurality of silicon micro-crystallites on a surface of said gate oxide using a plasma system; and
   flowing $SiH_4$, $GeH_4$ and $H_2$ into said deposition chamber to deposit silicon-germanium around the silicon micro-crystallites.

2. The method of forming a silicon-germanium film as claimed in claim 1, wherein in order to form said silicon micro-crystallite, $SiH_4$ is flowed at the rate ranging from about 5 to about 100 sccm and $H_2$ is flowed at the rate ranging from about 50 to about 1000 sccm.

3. The method of forming a silicon-germanium film as claimed in claim 1, wherein during the forming of said silicon micro-crystallite, pressure within said deposition chamber ranges from about several to about 1 to about 200 mTorr.

4. The method of forming a silicon-germanium film as claimed in claim 1, wherein during the forming of said silicon micro-crystallite a temperature of said semiconductor substrate ranges from about 450 to about 600° C.

5. The method of forming a silicon-germanium film as claimed in claim 1, wherein a plasma power of said plasma system ranges from about 10 to about 500 W.

6. The method of forming a silicon-germanium film as claimed in claim 1, wherein a size of each of said silicon micro-crystallite ranges from about 1 to about 7 nm.

7. The method of forming a silicon-germanium film as claimed in claim 1, wherein said silicon micro-crystallites are formed on the surface of the gate electrode with a high density and are narrowly spaced apart from one another.

8. The method of forming a silicon-germanium film as claimed in claim 1, wherein said silicon micro-crystallites are grown independently on the surface state of said gate oxide.

9. The method of forming a silicon-germanium film as claimed in claim 1, wherein sizes of each of said silicon micro-crystallites are controlled by a plasma power and a gas flow rate.

10. The method of forming a silicon-germanium film as claimed in claim 1, wherein said silicon micro-crystallites are used as nucleus creation sites when silicon-germanium is deposited around said silicon micro-crystallites.

11. The method of forming a silicon-germanium film as claimed in claim 1, wherein, upon deposition of silicon-germanium, $SiH_4$ is flowed at the rate ranging from about 20 to about 500 sccm, $GeH_4$ is flowed at the rate ranging from about 5 to about 100 sccm and $H_2$ is flowed at the rate ranging from about 100 to about 5000 sccm.

12. The method of forming a silicon-germanium film as claimed in claim 1, wherein during the depositing of said silicon-germanium, a temperature of said semiconductor substrate ranges from about 450 to about 600° C.

13. The method of forming a silicon-germanium film as claimed in claim 1, wherein during the depositing of said silicon-germanium, a pressure within said deposition chamber ranges from about 1 to about 200 Torr.

14. The method of forming a silicon-germanium film as claimed in claim 1, wherein the germanium contained in said deposited silicon-germanium ranges from about 5 to about 50%.

15. The method of forming a silicon-germanium film as claimed in claim 1, wherein the germanium in said deposited silicon-germanium is controlled by pressure, temperature and gas flow rate.

16. A method of forming a silicon-germanium film comprising:
   fixing a semiconductor substrate on which a gate oxide is formed, within a deposition chamber;
   flowing $SiH_4$ and $H_2$ into said deposition chamber and forming silicon micro-crystallites on a surface of said gate oxide using thermal electrons emitted from a filament; and
   flowing $SiH_4$, $GeH_4$ and $H_2$ into said deposition chamber to deposit silicon-germanium around the silicon micro-crystallites.

17. The method of forming a silicon-germanium film as claimed in claim 16, wherein $SiH_4$ is flowed at a rate ranging from about 5 to about 100 sccm and $H_2$ is flowed at a rate ranging from about 50 to about 1000 sccm.

18. The method of forming a silicon-germanium film as claimed in claim 17, wherein HCl is simultaneously flowed with the $SiH_4$ and $H_2$.

19. The method of forming a silicon-germanium film as claimed in claim 18, wherein HCl is flowed at a rate below 200 sccm.

20. The method of forming a silicon-germanium film as claimed in claim 16, wherein during the forming of said silicon micro-crystallites, a pressure within said deposition chamber ranging from about 1 to about 200 mTorr.

21. The method of forming a silicon-germanium film as claimed in claim 16, wherein in order to form said silicon micro-crystallite, a temperature of said semiconductor substrate ranging from about 450 to about 600° C.

22. The method of forming a silicon-germanium film as claimed in claim 16, wherein said filament is installed adjacent a gas injection of said deposition chamber and is maintained at a temperature ranging from about 1500 to about 2400° C.

23. The method of forming a silicon-germanium film as claimed in claim 16, wherein said filament comprises tungsten (W) or tungsten(W) and thorium (Th) wherein the thorium(Th) is present in an amount ranging from about 1 to about 5%, and said filament is connected to a molybdenum (Mo) rod.

24. The method of forming a silicon-germanium film as claimed in claim 23, wherein in order to prevent an increase in a temperature of said semiconductor substrate, a distance between said Mo rod connected to said filament and said semiconductor substrate ranges from about 3 to about 5 cm and connection of said Mo rod to said filament is made in parallel to said semiconductor substrate.

25. The method of forming a silicon-germanium film as claimed in claim 16, wherein a size of each of said silicon micro-crystallite ranges from about 1 to about 7 nm.

26. The method of forming a silicon-germanium film as claimed in claim 16, wherein the distance between said silicon micro-crystallites are formed on the surface of the gate electrode with a high density and narrowly spaced apart from one another.

27. The method of forming a silicon-germanium film as claimed in claim 16, wherein said silicon micro-crystallites are grown independently on the surface state of said gate oxide.

28. The method of forming a silicon-germanium film as claimed in claim 16, wherein sizes of each of said silicon micro-crystallites are controlled by a temperature of said filament and the gas flow rate.

29. The method of forming a silicon-germanium film as claimed in claim 16, wherein said silicon micro-crystallites are used as nucleus creation sites when silicon-germanium is deposited around said silicon micro-crystallites.

30. The method of forming a silicon-germanium film as claimed in claim 16, wherein upon deposition of silicon-germanium, $SiH_4$ is flowed at a rate ranging from about 20 to about 500 sccm, $GeH_4$ is flowed at a rate ranging from about 5 to about 100sccm and $H_2$ is flowed at a rate ranging from about 100 to about 5000 sccm.

31. The method of forming a silicon-germanium film as claimed in claim 16, wherein during the depositing of said silicon-germanium, a temperature of said semiconductor substrate ranges from about 450 to about 600° C.

32. The method of forming a silicon-germanium film as claimed in claim 16, wherein during depositing of said silicon-germanium, a pressure within said deposition chamber ranges from about 1 to about 200 Torr.

33. The method of forming a silicon-germanium film as claimed in claim 16, wherein the germanium in said silicon-germanium film is present in an amount ranging from about 5 to about 50%.

34. The method of forming a silicon-germanium film as claimed in claim 16, wherein the amount of germanium contained in said silicon-germanium film is controlled by pressure, temperature and gas flow rate.

* * * * *

UNITED STATES PATENT AND TRADEMARK OFFICE
CERTIFICATE OF CORRECTION

PATENT NO.     : 6,605,520 B2
DATED          : August 12, 2003
INVENTOR(S)    : Woo. S. Cheong It is certified that error appears in the above-identified patent and that said Letters Patent is hereby corrected as shown below:

Column 6,
Line 12, delete "gate electrode" and replace with -- gate oxide -- in its place.

Column 7,
Line 31, delete "gate electrode" and replace with -- gate oxide -- in its place.

Signed and Sealed this

Second Day of March, 2004

JON W. DUDAS
*Acting Director of the United States Patent and Trademark Office*